(12) United States Patent
Suzuki et al.

(10) Patent No.: US 7,699,997 B2
(45) Date of Patent: Apr. 20, 2010

(54) METHOD OF RECLAIMING SILICON WAFERS

(75) Inventors: Tetsuo Suzuki, Kobe (JP); Satoru Takada, Hayward, CA (US)

(73) Assignees: Kobe Steel, Ltd., Kobe-shi (JP); Kobe Precision Inc., Hayward, CA (US)

( * ) Notice: Subject to any disclaimer, the term of this patent is extended or adjusted under 35 U.S.C. 154(b) by 285 days.

(21) Appl. No.: 10/677,309

(22) Filed: Oct. 3, 2003

(65) Prior Publication Data

US 2005/0092349 A1    May 5, 2005

(51) Int. Cl.
    C03C 25/68    (2006.01)
(52) U.S. Cl. .................................................. 216/55
(58) Field of Classification Search ............ 216/88, 216/89, 96, 99; 438/4, 471, 473
See application file for complete search history.

(56) References Cited

U.S. PATENT DOCUMENTS

| | | | |
|---|---|---|---|
| 3,923,567 A | | 12/1975 | Lawrence |
| 5,290,361 A | * | 3/1994 | Hayashida et al. ............ 134/2 |
| 5,622,875 A | | 4/1997 | Lawrence |
| 5,810,940 A | * | 9/1998 | Fukazawa et al. ............. 134/3 |
| 5,837,662 A | * | 11/1998 | Chai et al. ................. 510/175 |
| 5,855,735 A | | 1/1999 | Takada et al. |
| 5,885,334 A | | 3/1999 | Suzuki et al. |
| 5,932,022 A | * | 8/1999 | Linn et al. .................. 438/795 |
| 6,054,373 A | * | 4/2000 | Tomita et al. ............... 438/476 |
| 6,100,167 A | * | 8/2000 | Falster et al. ............... 438/502 |
| 6,384,415 B1 | | 5/2002 | Suzuki et al. |
| 6,406,923 B1 | | 6/2002 | Inoue et al. |
| 6,451,696 B1 | | 9/2002 | Hara et al. |
| 6,884,634 B2 | * | 4/2005 | Suzuki et al. .................. 438/4 |
| 2001/0039101 A1 | | 11/2001 | Wenski |
| 2004/0063227 A1 | | 4/2004 | Suzuki et al. |
| 2004/0108297 A1 | * | 6/2004 | Erk et al. ........................ 216/2 |

FOREIGN PATENT DOCUMENTS

| | | |
|---|---|---|
| EP | 1 205 968 A2 | 5/2002 |
| JP | 5-315428 | 11/1993 |
| JP | 6-168998 | 6/1994 |

(Continued)

OTHER PUBLICATIONS

E. R. Weber, Applied Physics A, vol. 30, pp. 1-22, "Transition Metals in Silicon", 1983.

(Continued)

*Primary Examiner*—Parviz Hassanzadeh
*Assistant Examiner*—Maureen Gramaglia
(74) *Attorney, Agent, or Firm*—Oblon, Spivak, McClelland, Maier & Neustadt, L.L.P.

(57) ABSTRACT

A method of reclaiming silicon wafers including a film removal process, a polishing process, and a cleaning process, wherein a heating/removal process for removing a silicon wafer surface part by heating at 150-300° C. for 20 minutes to 5 hours is further included between the film removal process and the polishing process is provided. The present invention provides a useful method of reclaiming silicon wafers that removes Cu not only deposited on a surface but also penetrated inside of a silicon wafer, and does not give Cu contamination inside of the silicon wafer.

14 Claims, 6 Drawing Sheets

FOREIGN PATENT DOCUMENTS

| | | |
|---|---|---|
| JP | 7-122532 | 5/1995 |
| JP | 9-017833 | 1/1997 |
| JP | 9-64052 | 3/1997 |
| JP | 9-064133 | 3/1997 |
| JP | 2000-164558 | 6/2000 |
| JP | 2001-174375 | 6/2001 |
| JP | 2001-213694 | 8/2001 |
| JP | 2002-158207 | 5/2002 |
| JP | 2002-270568 | 9/2002 |
| KR | 2000-17512 | 3/2000 |

OTHER PUBLICATIONS

H. Prigge, et al., J. Electrochem. Soc., Technical Papers, Solid-State Science and Technology, vol. 138, No. 5, pp. 1385-1389, "Acceptor Compensation in Silicon Induced by Chemomechanical Polishing", May 1991.

M. B. Shabani, et al., J. Electrochem. Soc., vol. 143, No. 6, pp. 2025-2029, "Low-Temperature Out-Diffusion of Cu From Silicon Wafers", Jun. 1996.

A. A. Istratov, et al., Physical Review Letters, vol. 81, No. 6, pp. 1243-1246, "Intrinsic Diffusion Coefficient of Interstitial Copper in Silicon", Aug. 10, 1998.

C. Beaudry, et al., Micro, pp. 41-54, "Evaluating Wafer Reclaim Techniques in Emerging Copper Processes", Mar. 2000.

* cited by examiner

METHOD OF RECLAIMING SILICON WAFERS

BACKGROUND OF THE INVENTION

1. Field of the Invention

The present invention relates to a method of reclaiming silicon wafers that permits of reclamation of silicon wafers once used in manufacturing processes for semiconductor devices, as silicon wafers for testing (used for the purposes of monitoring semiconductor chips manufacturing process, and setting up the operating conditions of semiconductor fabrication machines and equipment). In particular, it relates to a method of reclaiming silicon wafers without Cu contamination.

2. Description of the Related Art

Methods of reclaiming used silicon wafers include, in general, a film removal process for removing films formed on the wafer surface concerned, a polishing process for giving mirror finish to the wafer after the film removal process concerned, a cleaning process for cleaning the polished wafer concerned, and a quality evaluation process for evaluating quality of final products. A process distinctive to reclamation of silicon wafers among the processes is a film removal process. The reason is that silicon wafers after film removal have same state as that of virgin wafers, and accordingly same processes may be adopted as in virgin silicon wafers as a subsequent process (polish process and cleaning process).

Various methods for improving the film removal process and reclaiming silicon wafers have been proposed. For example, Referential Patent 1 (U.S. Pat. No. 5,855,735 specification) discloses a reclamation method including a process to remove films while introducing slight micro cracks, using a polishing liquid including abrasive grain and a rotating pad (refer to claims etc.) Moreover, Referential Patent 2 (U.S. Pat. No. 3,923,567 specification) discloses a reclamation method including an etching method using acids as a method of removing metal films, silicon oxide films, and silicon nitrides (refer to claims etc.) Furthermore, Referential Patent 3 (Japanese Patent Laid-Open No. 9-17833 official report) discloses a reclamation method in which in advance of film removal, estimation of kinds of films currently formed as a film on a silicon wafer concerned is performed based on a measurement of infrared absorption spectrum of used silicon wafers, and subsequently, etching suitable for a type of the film is applied to remove the film (refer to claims etc.).

Since removing of films by the methods may reduce concentration of metals that exist in a surface of films, these methods are effective in reclaiming used silicon wafers having films including main metals (Al, Ti, W, etc.) used during manufacturing processes of semiconductor chips. That is, in reclamation processes of silicon wafers, used silicon wafers are processed having films including various metals, such as metal films, metal silicide films, metal oxide films, and metal nitride films formed thereon. Although metals, such as Al, Ti, and W, might probably deposit again onto a surface of silicon wafers during reclamation in those methods, it was not estimated that the metals might be penetrated inside, and therefore only use of the film removal method enabled reduction of a surface metal concentration.

However, instead of Al conventionally widely used, in many cases, Cu as a wiring material is increasingly used. The reason is that Cu has more excellent electrical conductivity compared with Al, has a high electromigration resistance, and is believed to be more suitable as a wiring material. However, there has been a problem that a very larger diffusion factor in silicon of Cu as compared with other transition metals induces not only deposition of Cu on a silicon wafer surface but penetration inside the silicon wafer during reclamation processes, leading to easy diffusion thereof. Moreover, contamination by Cu spreads in each step of reclamation processes, and concerns are rising that a chain of contamination of furthermore contaminating other products. And removing of Cu penetrated inside is difficult even by the film removal methods mentioned above.

Then, in view of reclaiming silicon wafers with a copper film deposited thereon, Referential Patent 4 (Japanese Patent Laid-Open No. 2002-158207 official report) discloses a method for solving and removing the copper film with a specific etching chemical solution (refer to claims etc.) However, this method is proposed for the purpose of removal of a copper film, and prevention of deposition of Cu on a surface of the silicon wafer, and cannot remove Cu penetrated inside of the silicon wafer. Accordingly, in the case where a silicon wafer reclaimed by this method is used as a test wafer, a particular film (a copper diffusion barrier film or a $SiO_2$ film) is formed on a wafer surface ([0009]).

Besides, Referential Patent 5 (Japanese Patent Laid-Open No. 2000-164558 official report) discloses a method of reclaiming silicon wafers with metal films in which an oxide film is formed in a under layer of a metal film of a test wafer, all metal films and a part of minimum oxide films are removed by chemical etching with alkaline solution or acidic solution, and further metal contaminants on a surface of the oxide film is removed by chemical etching with acidic solution (refer to the claim etc.) However, the method forms a silicon oxide film as a base layer in order to avoid penetration of metals inside of the silicon wafer, such as Cu, and has no intention of removal of Cu penetrated inside of the silicon wafer.

Thus, although conventional methods of reclamation of silicon wafers may remove Cu deposited to a surface of silicon wafers, they may not remove Cu penetrated inside of the silicon wafers.

Although it is not a technique disclosed as a method of reclaiming silicon wafers on the other hand, Referential Patent 6 (Japanese Patent Laid-Open No. 9-64113 official report) discloses a method of detection having a process of heating a semiconductor substrate at temperatures of no more than 600° C., and a process of measuring a surface of the semiconductor substrate for a concentration of Cu, as a nondestructive method for detecting a concentration of Cu diffused inside of a silicon wafer (refer to claims etc.) This method utilizes a phenomenon in which heating of a semiconductor substrate diffuses Cu incorporated inside of the silicon wafer toward a surface thereof, and describes that heating at temperatures of no less than 600° C. diffuses Cu inside of the silicon wafer to gather Cu to a surface of the substrate ([0009]). And it indicates conditions of: at 500° C. for 15 minutes for P-type silicon wafers, and at 500° C. for 2 hours for N-type silicon wafers as a detailed a heated condition ([0012]). However, since heating at such high temperatures impairs quality of silicon wafers, as mentioned below, it is unsuitable to apply the method for a method of reclaiming used silicon wafers.

Moreover, Referential Patent 7 (Japanese Patent Laid-Open No. 2002-270568 official report) discloses a method for managing a metal concentration on a surface of wafers by controlling to limit a concentration of metals (Fe or Cu) in an etching solution and a cleaning liquid that directly contact wafers to no more than a predetermined value in manufacturing semiconductor wafers (claims etc.) This method, however, only control a metal concentration on a surface of wafers in order to avoid depositing of metals, such as Cu, to the surface of the wafers surface ([0005]), and has no intention at all about removing metals penetrated inside of the wafers.

SUMMARY OF THE INVENTION

Under the circumstances as described above, the present invention aims at providing a method of reclaiming silicon wafers in which Cu not only deposited on a surface of silicon wafers but penetrated inside is removed, and Cu contamination inside of the silicon wafers is eliminated.

A preferred aspect of the present invention to attain the object resides in a method of reclaiming silicon wafers which includes a film removal process, a polish process, and a cleaning process, wherein it comprises a heating/removal process for heating the silicon wafers at 150-300° C. for 20 minutes to 5 hours and for removing a surface of the silicon wafers, between the film removal process and the polish process.

DETAILED DESCRIPTION OF THE PREFERRED EMBODIMENTS

In reclaiming silicon wafers without Cu contamination, the present inventors have studied behavior (outer diffusion) of Cu incorporated inside of the silicon wafers in detail.

It is reported in, for example, M. B. Shabani, T. Yoshimi, H. Abe, J. Electrochem. Soc., Vol. 143, p 2025-2029 (1996) that Cu that penetrated into silicon wafers diffuses out to a surface. This report describes that heating of 1 hour at 400° C. of P-type silicon wafers gathers no less than 90% of Cu that penetrated inside of silicon wafers into a top surface of the silicon wafers by outer diffusion, and on the other hand, heating of 1 hour at 400° C. of N-type silicon wafers gathers approximately half Cu that penetrated inside of the silicon wafers in a top surface.

The authors have applied for the Referential Patent 6 based on this knowledge. In detail, there are disclosed a method to heat a P-type silicon wafer at 500° C. for 15 minutes; and a method to heat a N-type silicon wafer at 500° C. for 2 hours, respectively. Cu that diffused out in this way to a surface from inside of the silicon wafer is removable with cleaning by known silicon wafer cleaning liquids. However, heating at a high temperature about 500° C. impairs quality of the silicon wafer, which is not suitable for reclamation of silicon wafers.

Silicon wafers are manufactured by Czochralski method, in general, (called "Czochralski wafers"), and the wafers usually include oxygen about 10-20 ppma (atomic ppm) as impurities. When this Czochralski wafer is heated at 400-800° C., there is observed a phenomenon that oxygen included is converted into donors, which increases specific resistance of a P-type silicon wafer, and decreases specific resistance of a N-type silicon wafer. In the Referential Patent 6, temperatures (about 500° C.) shown as temperatures that can gather Cu in a silicon wafer surface by outer diffusion overlap temperatures at which oxygen is converted into a donor. Therefore, it turned out that application of an exact heating conditions in the Referential Patent 6 in reclamation process to silicon wafers varies specific resistance of the silicon wafers, and impairs quality thereof.

In order to provide a reclamation method for efficiently removing Cu penetrated inside of silicon wafers using outer diffusion, without varying specific resistance of P-type/N-type silicon wafers, the present inventors have furthermore advanced research, taking the information into consideration, especially focusing on three processes, (a) heating process, (b) Cu eliminating process after heating, and (c) chemically processing immersion process (adjustment process of a surface of silicon wafers) before heating.

As a result, there were made findings for completion of the present invention that:

(1) Cu penetrated inside of a silicon wafer may be migrated to a vicinity of a surface of the silicon wafer, without impairing quality of the silicon wafer by providing a predetermined heating processing between a film removal process and a polish process, and subsequently, the Cu may be eliminated by removing the surface using chemical methods or mechanical methods (a heating/removal process);

(2) when an immersion processing of immersing the silicon wafer in a predetermined chemical preparation liquid is performed especially before the heating process (1), further promoted outer diffusion of Cu enables much more efficient elimination of Cu inside of silicon (an immersion process before heating).

Detailed description about a method of the present invention will, hereinafter, be given based on experimental circumstances to complete the present invention.

(a) Heating Process

In the present invention, a range of heating temperature for outer diffusion of Cu penetrated inside of a silicon wafer, while avoiding formation of oxygen donors (namely, avoiding varying of specific resistance of a P-type/N-type silicon wafer), was determined no less than 150° C., and no more then 300° C. Description will, hereinafter, be given for experimental circumstances about setting of the temperature range.

(a-1) Maximum of Heating Temperatures

Figure 1:
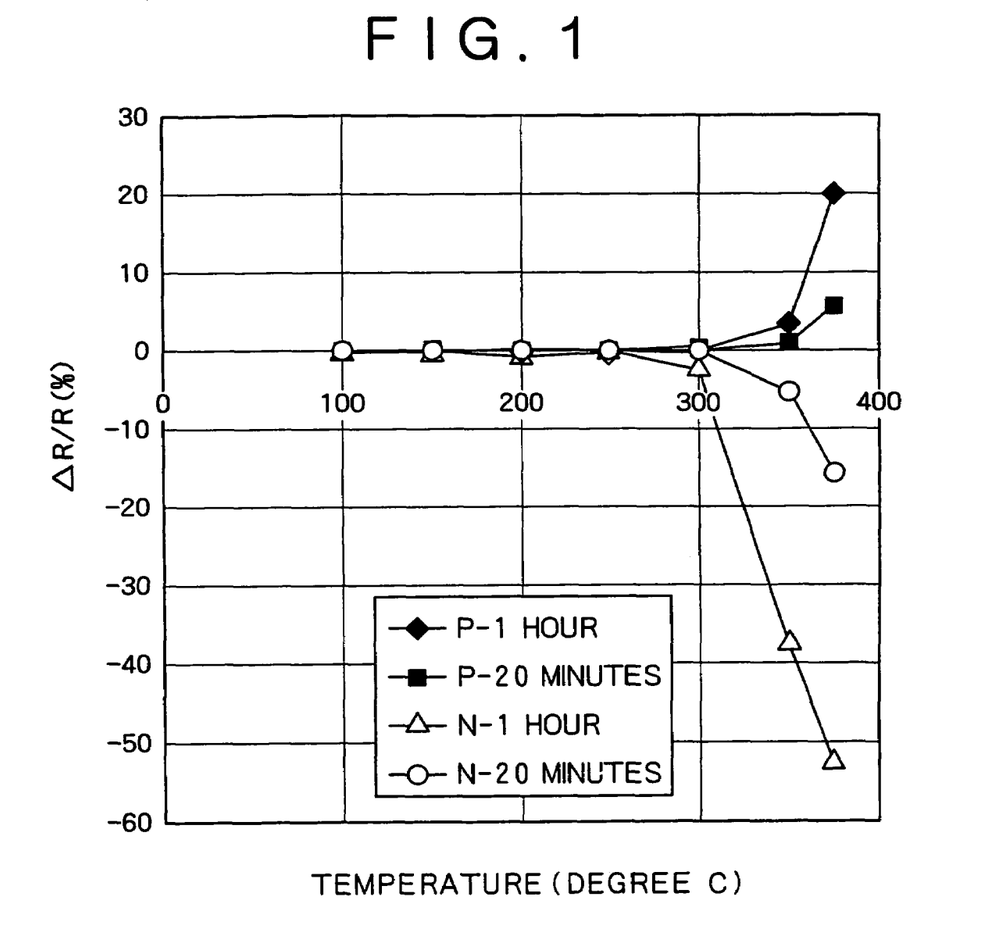
FIG. 1 is a graph showing a rate of change of specific resistance ($\Delta R/R$) of a P-type/N-type silicon wafer when heating temperature is varied.

Firstly, in order to decide clearly a maximum temperature of heating without varying a specific resistance value, a rate of change of a specific resistance by heating of P-type/N-type silicon wafer was examined. In detail, each silicon wafer before and after heating was measured for a specific resistance value according to ASTM F673, using an eddy current method, when heating at a temperature range of 100-370° C. for 20 minutes or 1 hour is given in air using each P-type and N-type Czochralski wafer having a specific resistance value in a range of 10-25 Ω-cm. FIG. 1 shows a graph of a relationship of a heating temperature and a rate of change ($\Delta R/R$: where $\Delta R$ represents a difference between specific resistances before and after heating; R represents a specific resistance before heating, respectively) of specific resistance. FIG. 1 shows that heating temperatures exceeding 300° C. also vary a rate of change of a specific resistance of each of the P-type/N-type silicon wafers. Therefore, in order to avoid varying a specific resistance value of a silicon wafer, it is required for maximum of a heating temperature to be 300° C.

(a-2) Minimum of Heating Temperatures

Next, in order to decide clearly a minimum temperature of heating required for outer diffusion of the Cu in the silicon, following experiments were conducted based on a report of H. Prigge, P. Gerlach, P. O. Hahn, A. Schnegg, and H. Jacob, J. Electrochem. Soc., Vol. 138, p 1385-1389 (1991). The report mentions following contents: when a P-type silicon wafer is polished with a polishing liquid with added Cu including amines, the Cu penetrates inside of the silicon wafer, increasing a specific resistance of the silicon wafer; and a reason is that when Cu penetrates inside of the P-type silicon wafer, a dopant (elements of III group represented by B, the element exists in a lattice point replacing silicon atom in a silicon crystal) charged in negative added in P-type silicon wafer is electrostatically drawn to Cu+ ion incorporated in the silicon crystal lattices to form a complex, and as a result of canceling of a part of a function of the dopant, electrical conductivity of the P-type silicon decreases.

The present inventors examined influence of heating temperatures on outer diffusion of Cu when a silicon wafer is intentionally contaminated with Cu, based on a rate of change ($\Delta R/R$) of specific resistance of the silicon wafer, referring to the report.

Figure 2A:
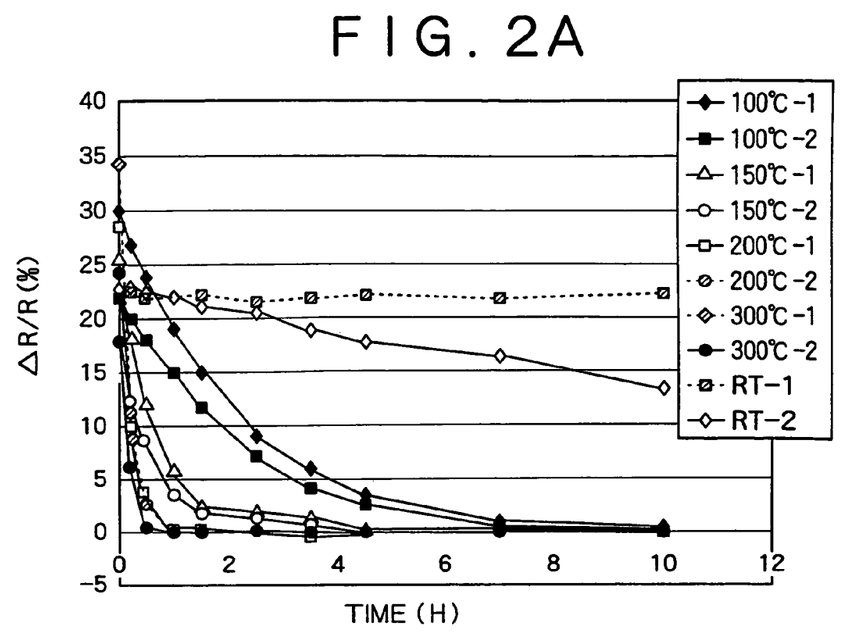
FIG. 2A is a graph showing a variation with time of a rate of change ($\Delta R/R$) of a specific resistance when a P-type silicon wafer polished with a polishing liquid including Cu added is heated.
Figure 2B:
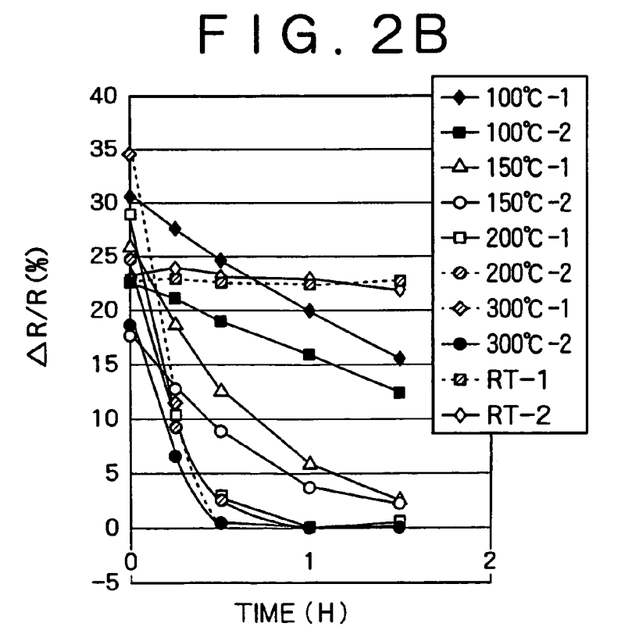
FIG. 2B is a partially enlarged drawing thereof.

Specifically, P-type silicon wafers having specific resistance values of 10-25 $\Omega$-cm were polished with a commercially available polishing liquid (colloidal silica) including alkanolamine with copper nitrate added equivalent to Cu of 2 ppm to introduce Cu into the P-type silicon wafers. Incidentally, in order to confirm whether Cu has been introduced into the silicon wafer by this polish processing, the P-type silicon wafer before and after polishing was measured for specific resistance values as in the method, and measured values before and after polishing showed increase in specific resistance values by 18-35%. This result revealed that the polishing processing surely introduced Cu into the silicon wafer. Subsequently, it was examined how rates of change ($\Delta R/R$) of the specific resistance of the silicon wafer with time is varies by heating of each of the each P type silicon wafer at temperatures of room temperature, 100° C., 150° C., 200° C., and 300° C. in air. Two examples of this experiment were performed for every heating temperature. FIG. 2A shows these results. By reference, FIG. 2B shows an enlarged drawing of rates of change ($\Delta R/R$) of the specific resistance in heating by 1.5 hours. In addition, that the rate of change ($\Delta R/R$) of specific resistance shows 0 represents returning to the specific resistance before polishing, in other words, which represents that Cu penetrated inside of a silicon wafer entirely migrated in a vicinity of a surface by diffusion.

Following considerations are deduced from the figures.

Firstly, when a silicon wafer was processed at room temperature (RT), even retention of 4 hours did not return the rate of change of specific resistance to 0. Furthermore, even extension by 10 hours of retention time did not vary most rates of change of the specific resistance of one sample, only also deteriorating the rate of change of other samples to approximately two thirds at most.

Moreover, although when a silicon wafer was heated at 100° C., heating of about 10 hours set a rate of change of specific resistance to about 0 (that is, it returns to the original specific resistance), a rate of change of the specific resistance in a reclamation period (it is about 4-5 hours at the maximum), which is a standard in an actual operation level, is still as high as 3-4%, and then it may not be admitted that Cu inside of the silicon wafer might be migrated to a surface.

On the other hand, in heating at 150° C. of a silicon wafer, although within experimental error, heating of about 4 hours almost recovered an original specific resistance, and heating for about 2 hours at 200° C., and heating for about 20 minutes at 300° C. have recovered original values, respectively. It is considered as follows: owing to Cu introduced inside of the silicon wafer migrated to a vicinity of a surface by the heating, a function for canceling dopant is lost thereby to recover an initial value of a value of a specific resistance. In addition, FIG. 2 does not show results in case of heating temperatures exceeding 300° C., but results revealed that the higher a heating temperature becomes, the easier it becomes to recover the original specific resistance value. That is to say, diffusion movement of Cu toward a surface is performed much more quickly.

That is, it became clear that processing for 20 minutes-5 hours at heating temperatures of no less than 150° C. may migrate Cu penetrated between crystalline lattices of a silicon wafer to the surface.

Based on the above experimental results (a-1) and (a-2), in the present invention, a heating temperature for performing outer diffusion of Cu penetrated inside of a silicon wafer within a reclamation period of an actual operation level (about 4-5 hours), while avoiding an oxygen donor formation, was determined as no less than 150° C. and no more than 300° C.

(b) Cu Eliminating Process After Heating

In order to migrate Cu penetrated inside of a silicon wafer to a top surface, it is required to set a heating temperature as highly as possible, as described above. On the other hand, it is not desirable to set heating temperatures high in order to avoid variation of a specific resistance of a silicon wafer, and it is required to set a maximum as 300° C.

Examination results of the present inventors revealed for the first time that setting of maximum of a heating temperature at 300° C. makes it difficult to completely migrate Cu existing inside of a silicon wafer to a top surface, which keeps Cu in a vicinity of the top surface (within approximately 1 μm from the top surface). Therefore, Cu remaining in a vicinity of the surface may not be completely eliminated only by cleaning with, for example, a cleaning liquid (hereinafter, referred to as a top surface cleaning liquid) for removing metals on a top surface, even if a heating temperature specified by the present invention migrates Cu inside of the silicon wafer to the vicinity of the surface. Then, it turned out that surface removal operation for removing about 1 μm of surface of the silicon wafer is required after heating of the present invention. Experimental circumstance for resulting in the conclusion will, hereinafter, be described.

Firstly, it was studied whether cleaning with a top surface cleaning liquid might remove Cu in silicon after heating (for about 20 minutes-5 hours, at 150-300° C.) specified by the present invention. As typical top surface cleaning liquids for metal removal, an SC (Standard Clean) 2 solution (mixture of $H_2O_2+HCl+H_2O$), diluted HF solution, and mixture of HF and $H_2O_2$, etc. may be mentioned. Each of these is known as a useful method for cleaning metals, such as Cu existing in a top surface (at most a depth from surface to about several nm) of silicon wafer. If the top surface cleaning liquid can reduce Cu in silicon to a concentration less than a limit of detection, it may be understood that heating by the present invention can migrate Cu in silicon to the top surface of the silicon wafer. However, if the top surface cleaning liquid cannot reduce Cu in silicon to a concentration less than a limit of detection, it should be understood that heating by the present invention cannot migrate Cu in silicon to the top surface of the silicon wafer.

In detail, a P-type silicon wafer having a specific resistance value of 11 Ω-cm and φ200 mm was polished by a polishing liquid including Cu to introduce Cu into the silicon wafer as in the method. In addition, this polishing method introduces Cu not only into the inside of the silicon wafer but into a surface of the silicon wafer. Accordingly, a cleaning, using a SC (Standard Clean) 1 solution (mixed solution of $H_2O_2$+ $NH_4OH$+$H_2O$), and a mixture of HF and $H_2O_2$, was beforehand performed in order to remove Cu deposited to the surface. Incidentally, since measured specific resistance values showed increase uniformly about 12% when specific resistance values of the silicon wafers processed in a same batch after the polishing, it was revealed clearly that Cu was surely introduced into the silicon wafers by this polishing processing. Moreover, in order to determine Cu concentration in the silicon wafer after polishing, the whole silicon wafer was immersed in a mixed solution of HF and $HNO_3$ to dissolve the whole wafer. The Cu concentration was determined by ICP-MS (Inductively Coupled Plasma Mass Spectrometry) method to obtain a concentration of $1.41 \times 10^{14}$ atom/cm$^3$ (equivalent to an "untreated" Cu concentration in FIG. 3 described later).

Figure 3:
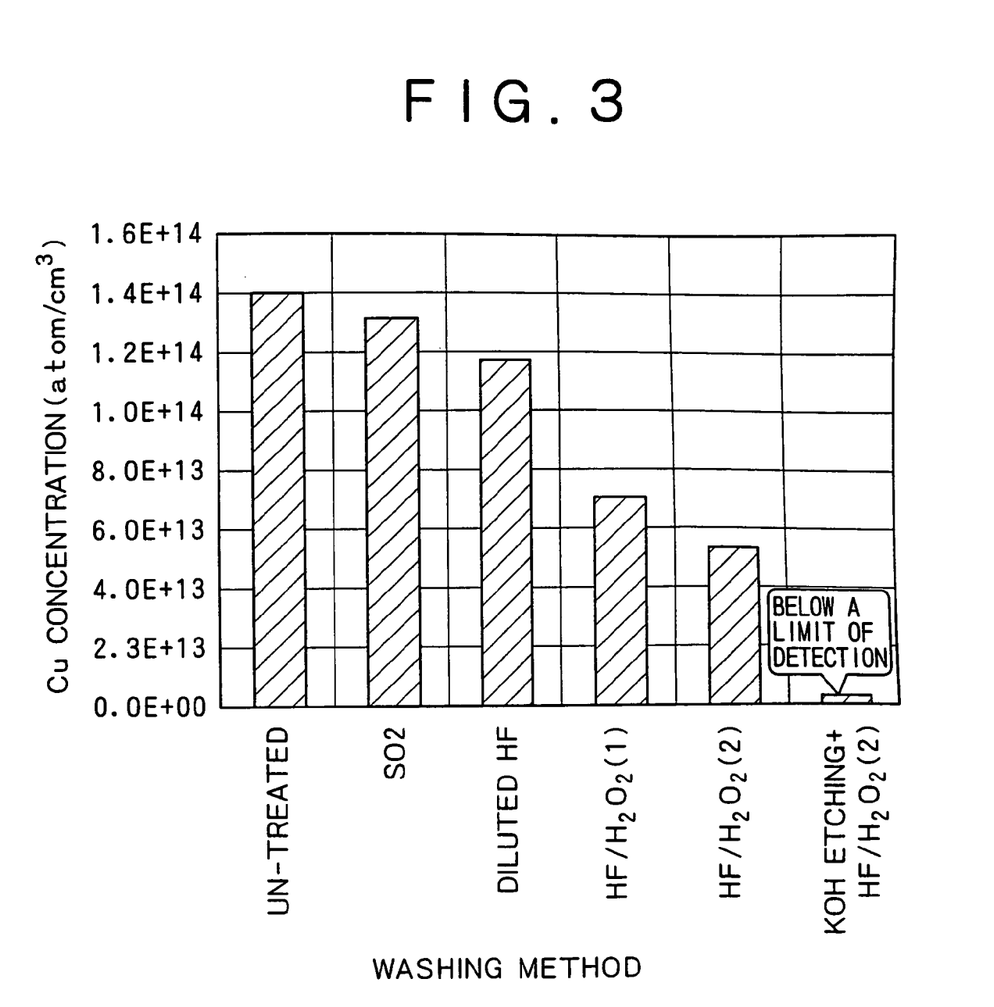
FIG. 3 is a graph showing Cu concentrations in a P-type silicon wafer when the silicon wafer polished with a polishing liquid including Cu added is cleaned with various cleaning liquids after being heated for 2 hours and 30 minutes at 250° C.

Subsequently, after heating the silicon wafer in which Cu was introduced at 250° C. for 2 hours and 30 minutes, it was cleaned with four kinds of top surface cleaning liquids [an SC2 solution, a diluted HF solution, a mixed solution (1) of HF and $H_2O_2$, and a mixed solution (2) of HF and $H_2O_2$], respectively. Here, the mixed solution (1) of HF and $H_2O_2$ was obtained by mixing 49% HF, 30% $H_2O_2$, and pure water by a volume ratio of 1:1:100, and the mixed solution (2) of HF and $H_2O_2$ was obtained by 49% HF, 30% $H_2O_2$, and pure water by a volume ratio of 1:10:89. Each silicon wafer after cleaning was immersed in the mixed solution of HF and $HNO_3$ to dissolve a whole wafer, and Cu concentration was determined as in the method (equivalent to a Cu concentration inside of the silicon wafer).

FIG. 3 shows these results. In addition, it was confirmed that the specific resistance value of the silicon wafer after the heating had recovered initial values (11 Ω-cm) within limits of experimental error.

FIG. 3 shows that none of cleaning with the top surface cleaning liquid might reduce Cu in silicon wafers to a concentration below a detection limit, and even cleaning with HF and $H_2O_2$ solution (2) showing highest Cu removal function among them gave about 40 percent of Cu remained.

Thus, a reason why even cleaning using a top surface cleaning liquid remained much Cu in the silicon wafer is probably because the heating temperature is low (250° C.), and only the heating (2.5 hours at 250° C.) could not completely migrate the Cu penetrated inside of the silicon wafer to a top surface but had fixed it in a vicinity of the surface. Therefore, the experiment suggests that in order to completely remove Cu migrated to the vicinity of the surface after performing heating specified by a present invention, only cleaning of the top surface of the silicon wafer is inadequate, and it is necessary to remove the surface layer of the silicon wafer.

Therefore, the silicon wafer which was subjected to the predetermined heating process was immersed into a KOH aqueous solution as alkali solution before a process of cleaning with a top surface cleaning liquid, and thereby to remove a surface layer about 1 μm by etching. After that, the silicon wafer was cleaned with the top surface cleaning liquid (2) of HF and $H_2O_2$. When the Cu concentration in the silicon wafer given such processing was determined as in the method, it became clear that the Cu concentration may be reduced no more than a detection limit ($2 \times 10^{12}$ atom/cm$^3$) as shown in FIG. 3.

In the experiment, an etching removal operation of the silicon wafer surface layer by an alkali solution and a cleaning operation of the silicon wafer top surface by a top surface cleaning liquid are performed in combination to prevent Cu seemed to have been removed with alkali solution from being deposited in the top surface again. However, these operations need not be performed in combination in all reclamation processes. Experimental results confirms that in the case where there are very few possibilities that Cu may redeposit to a top surface etc., only etching removal operation of the silicon wafer surface layer by an alkali solution may reduce a Cu concentration no more than a detection limit.

(c) Immersion Process with a Chemical Processing Liquid before Heating (Adjustment Process of a Surface of a Silicon Wafer)

Furthermore, in the present invention, in order to promote outer diffusion of Cu introduced into the inside of a silicon wafer before the heating, it is recommended that an immersion process being immersed in a specific chemical processing liquid may be included.

Description will be given, hereinafter, about experimental circumstances resulting in specification of this process.

As clearly shown in the experiment of (b) mentioned above, although Cu penetrated inside of a silicon wafer is movable to a vicinity of a surface of a silicon wafer with heating specified by the present invention, it may not migrate the Cu to a top surface of the silicon wafer. Then, the present inventors considered the possibility for the outer diffusion of Cu to be promoted by immersing a silicon wafer into chemical treatment liquids and by adjusting a surface state of the silicon wafer before heating. And they studied that using various chemical treatment liquids.

Figure 4:
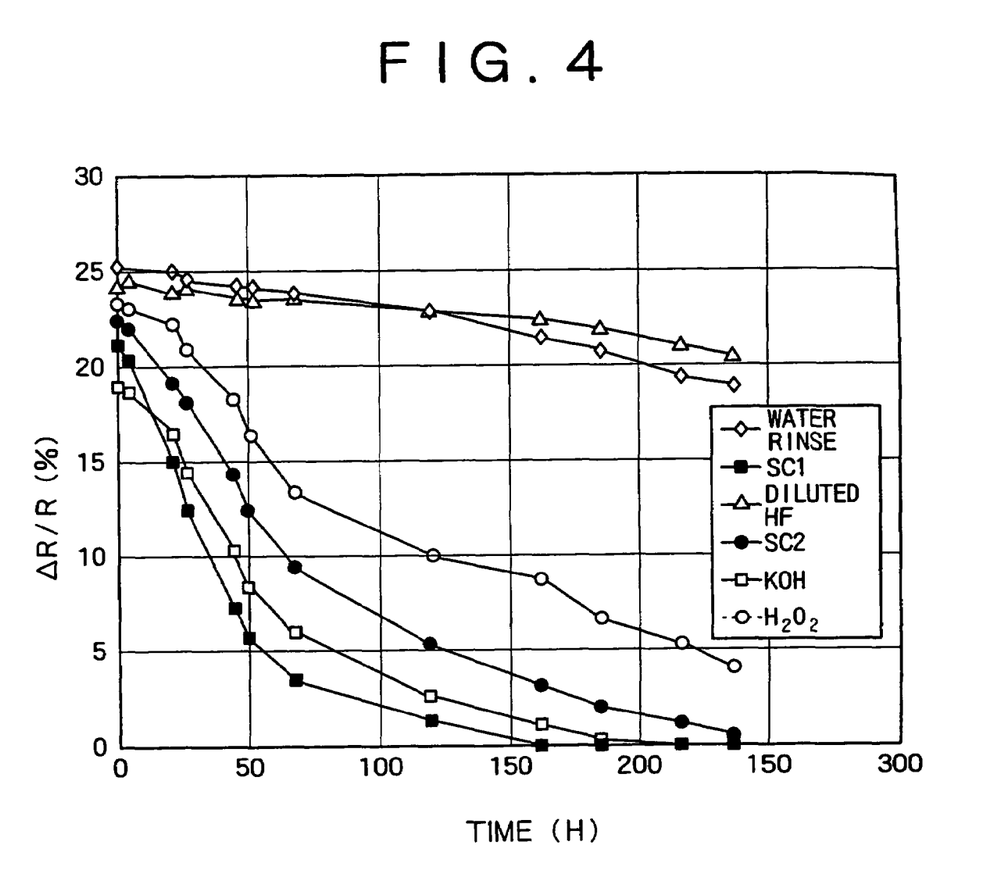
FIG. 4 is a graph showing a variation of a rate of change ($\Delta R/R$) of specific resistance of a P-type silicon wafer with time when the silicon wafer polished with a polishing liquid including Cu added is immersed in various processing liquids.

When a silicon wafer including Cu was processed at room temperature (RT) as shown in the FIG. 2, large differences were recognized in the recovery of specific resistances between silicon wafers. This suggests that a surface state of a silicon wafer affects outer diffusion of Cu. Therefore, we examined the behavior of outer diffusion of Cu inside a silicon wafer by artificially introducing Cu into P type silicon wafers as in the above-mentioned method and subjecting the silicon wafers to cleaning and immersing processes in six kinds of processing liquids thereby to measure the silicon wafers for its rates of change (ΔR/R) of specific resistances with time at room temperature. The six kinds of processing liquids as shown in FIG. 4 is: (i) water (water rinse); (ii) an SC1 liquid (mixed-solution of $H_2O_2$, $NH_4OH$, and $H_2O$); (iii) a diluted HF liquid; (iv) an SC2 liquid (mixed-solution of $H_2O_2$, HCl, and $H_2O$); (v) a KOH aqueous solution; and (iv) a $H_2O_2$ aqueous solution. FIG. 4 shows the measurement results.

As shown in FIG. 4, in the silicon wafers cleaned with (i) water rinse and (iii) a diluted HF liquid, rates of change (ΔR/R) of specific resistances hardly decrease even after 250 hours passed after cleaning and the recovery of specific resistances are very slow, while in the silicon wafers immersed in (ii) an SC1 liquid, (iv) an SC2 liquid, (v) a KOH aqueous solution, and (iv) a $H_2O_2$ aqueous solution, the recovery of specific resistances is markedly promoted. In particular, when immersed in (ii) an SC1 liquid and (v) a KOH aqueous solution, the recovery of specific resistance has appeared to be much more notably promoted. As for the specific resistance, in (ii) an SC1 liquid, original values were recovered after about 150 hours while in (v) KOH aqueous solution, original values were recovered after about 200 hours.

The above basic experiments show that immersion of the wafers into (ii) an SC1 liquid, (iv) an SC2 liquid, (v) a KOH aqueous solution, and (iv) a $H_2O_2$ aqueous solution before heating specified by the present invention promotes outer diffusion of Cu. This suggests that a surface state of a silicon wafer is adjusted with these chemical treatment liquids.

Next, it was examined how an immersion operation with the chemical treatment liquids actually varies Cu concentrations on a surface of a silicon wafer.

Figure 5:
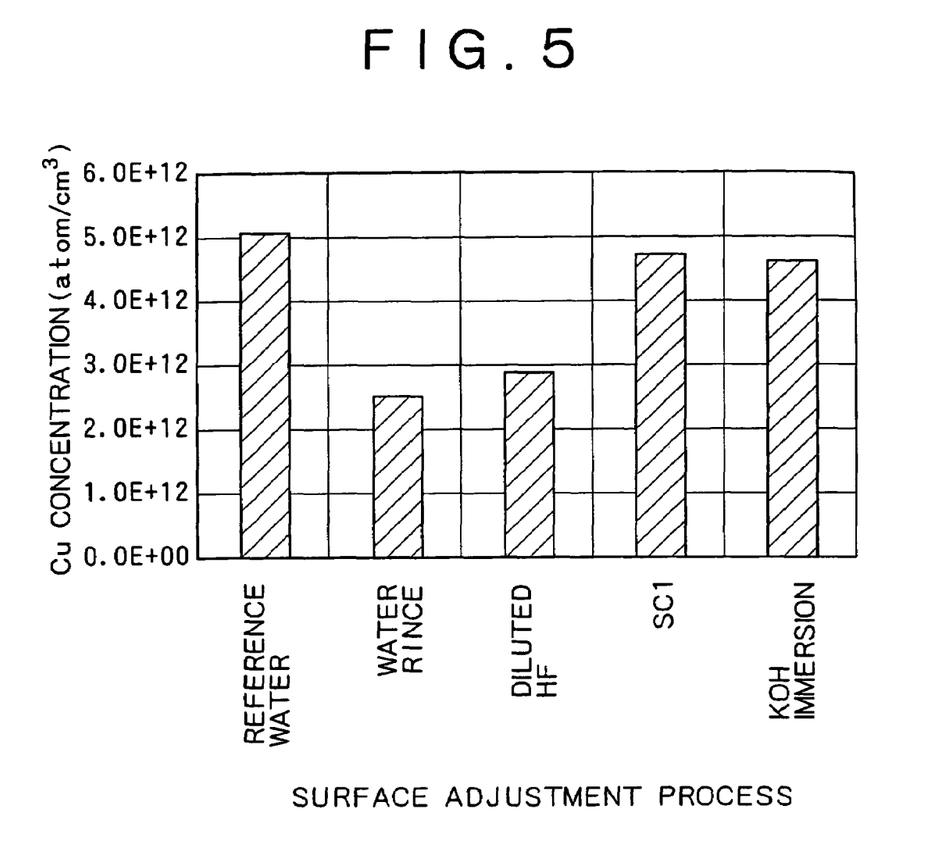
FIG. 5 is a graph showing Cu concentrations that migrated to a top surface from inside of a wafer, when the wafer is heated after immersed in various processing liquids.

Firstly, after artificially introducing Cu into silicon wafers as in the method, the silicon wafers were immersed in four kinds of processing liquids shown in FIG. 5, i.e., (i) water (water rinse), (ii) a diluted HF liquid, (iii) an SC1 liquid, and (iv) a KOH aqueous solution, and were heated (at 250° C. for 2 hours and 30 minutes). Subsequently, Cu concentrations on a surface of the silicon wafers were determined using a VPD ICP-MS method (Vapor Phase Decomposition Inductively Coupled Plasma Mass Spectrometry). FIG. 5 shows the measurement results.

Note that a "reference wafer" in FIG. 5 is defined as the silicon wafer where Cu is introduced into it as mentioned above before the cleaning process by a diluted HF liquid and heated at 400° C. for 2 hours and 30 minutes. Incidentally, the Referential Patent 6 describes that the heating process for 1 hour at 400° C. causes no less than 90% of Cu which is introduced into the inside of a silicon wafer to migrate to a top surface. To take that into account, a surface Cu concentration of the reference wafer to which the heating process for 2 hours and 30 minutes at 400° C. was given is considered to be equivalent to about 100% of Cu which has been penetrated inside of a silicon wafer. That is to say; the surface Cu concentration of the reference wafer may be substantially equal to the concentration of the Cu which has been penetrated inside of the silicon wafer.

FIG. 5 shows that the thermally-processed surface Cu concentration of the silicon wafer after immersed in a diluted HF liquid is only about 60 percent of that of the reference wafer. This means that 40 percent of Cu penetrated inside remains in the wafer. Similarly, the thermally-processed surface Cu concentration of the silicon wafer after water rinse is given is only 50 percent of that of the reference wafer. Therefore, it turned out that an immersion into these processing liquids hardly gives the outer diffusion promoting effect of Cu.

On the other hand, each surface Cu concentration of the thermally-processed silicon wafers after immersed in an SC1 liquid or a KOH aqueous solution is equivalent to no less than 90 percent of that of the reference wafer. Therefore, it turned out that immersing the silicon wafers in these chemical treatment liquids to appropriately adjust the silicon wafer surface before heating enables the outer diffusion of the Cu to be further promoted. In addition, experimental results confirm that immersing the silicon wafers in an SC2 liquid, a KOH aqueous solution, or a $H_2O_2$ aqueous solution other than the processing liquids enables the outer diffusion effect of Cu to be similarly obtained.

As mentioned above, description has been given about basic experiments to specify a method of the present invention.

Next, a method of reclaiming silicon wafers concerning the present invention defined based on the basic experiments will be described in full detail.

Figure 6:
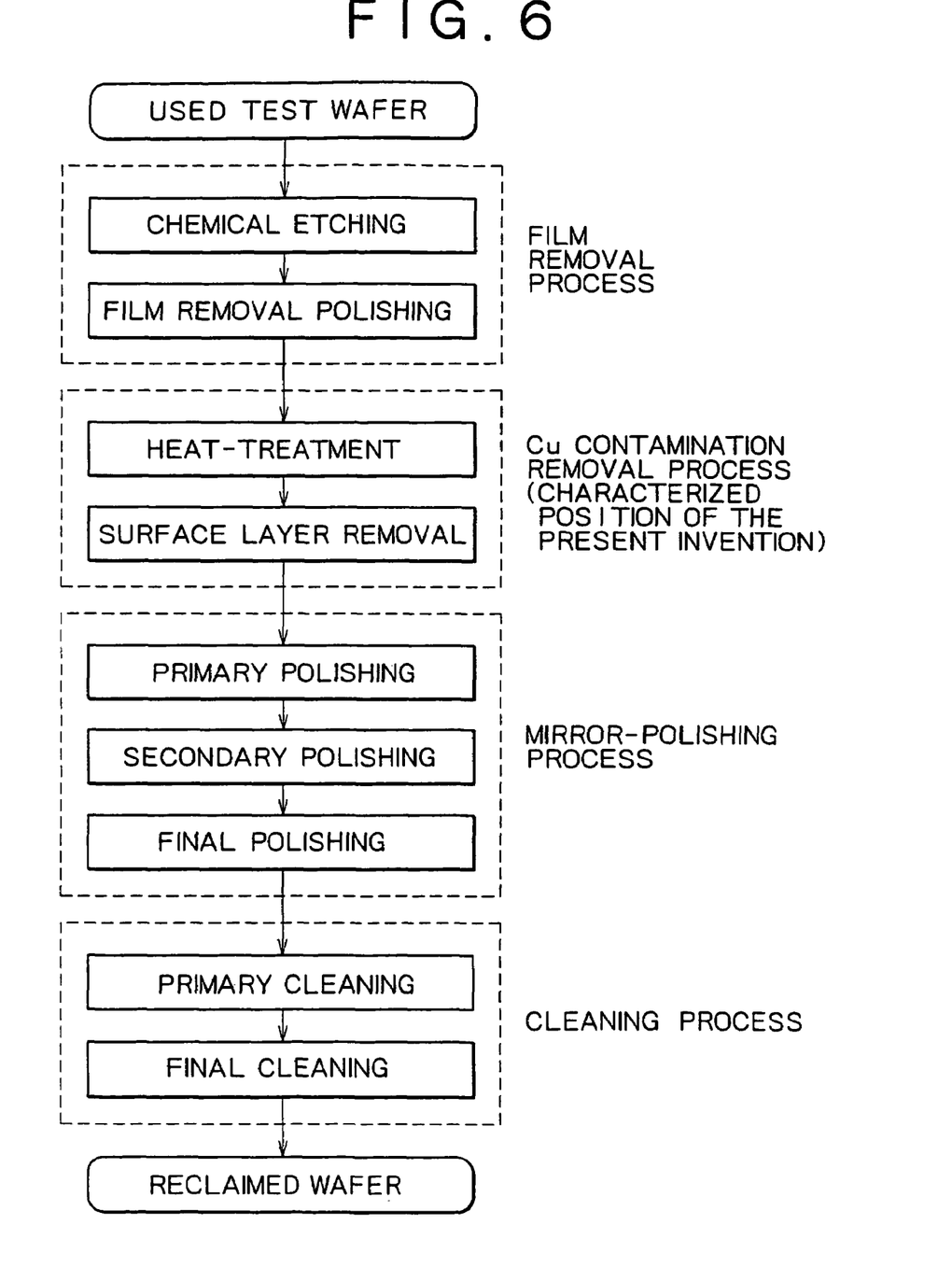
FIG. 6 shows a reclamation process of silicon wafers.

The present invention is characterized by a method of reclaiming silicon wafers including a film removal process, a polishing process, and a cleaning process as mentioned above, wherein a heating/removal process for removing a silicon wafer surface part by heating at 150-300° C. for 20 minutes to 5 hours is included between the film removal process and the polishing process. By reference, a reclamation process of the present invention is illustrated in FIG. 6.

Heating process may be performed at 150-300° C. for 20 minutes-5 hours.

The heating utilizes a phenomenon in which heating diffuses and migrates Cu penetrated inside of silicon to a surface. The present invention has a first feature that a maximum of a heating temperature is particularly specified in order to attain an original object of "reclamation of a silicon wafer".

A minimum of a heating temperature may be 150° C. based on a basic experiment in FIG. 2 as mentioned above. When a heating temperature is less than 150° C., a diffusion velocity for diffusing Cu penetrated between silicon crystalline lattices to a surface is slow (a remarkable long time is required), the temperature is not practical for the method of reclaiming silicon wafers. It may preferably be no less than 180° C., and more preferably no less than 230° C.

A maximum of heating temperatures is 300° C. based on basic experiments in FIG. 1 as mentioned above. The maximum temperature is so defined as to guarantee quality of the silicon wafer. Specifically, the maximum temperature aims to prevent electric resistance from varying by the factors other than Cu by donor formation with oxygen between crystalline lattices of a silicon wafer etc., and also to avoid the donor formation so as not to make the reclamation of the silicon wafer difficult. Moreover, a high heating temperature may possibly combine Cu with various defects in silicon to impair the quality of the silicon wafer itself.

Furthermore, a heating temperature higher than 300° C. increases the concentration of Cu that exists in solid solution state in silicon (concentration of Cu that exists as equilibrium concentration in a silicon wafer), which is not practically usable. Since the concentration of Cu that exists in solid solution state in the silicon is also low enough when a heating temperature is no more than 300° C., the reclamation of the silicon wafer in a convenient range is practically possible. This point is, for example, supported by the following reference etc.

Under the condition where many reports about diffusion coefficient of Cu in silicon have been disclosed, reliable values are recently reported in a range of 265-1173K (A. A. Istratov, C. Flink, H. Hieslmair, E. R. Weber, and T. Heiser, Phys. Rev. Lett., Vol. 81, p 1243-1246 (1998)). This report discloses a diffusion coefficient assuming that migration of Cu on a surface from an inside of a silicon wafer proceeds only by diffusion. For example, a diffusion length shows 0.8 mm at 150° C. for 1 hour, which is equivalent to a thickness (about 0.6-0.8 mm) of a silicon wafer. In other words, Cu diffuses to an equivalent length for a thickness of a silicon wafer under the condition of heating at 150° C. for 1 hour. When a known data (E. R. Weber, Appl. Phys., Vol. A30, p 1-22 (1983)) in a temperature range of 800-500° C. is inserted here to the concentration of Cu that exists in solid solution state in the silicon, a concentration of Cu that exists in solid solution state in the silicon in a maximum (300° C.) of heating temperatures specified by the present invention shows a very low value of $4.3 \times 10^{10}$ atom/cm$^3$. This satisfactorily suggests a possibility that Cu penetrated inside of a silicon wafer may be eliminated by outer diffusion to a level practically usable, even when a silicon is heated at a temperature (no more than 300° C.), which can not afford to vary a specific resistance, instead of being heated at a temperature (a high temperature of about 500° C.), which can afford to vary a specific resistance of P type/N type silicon wafer (see Referential Patent 6 as mentioned above).

Based on the above viewpoint, a maximum of a heating temperature is defined as 300° C. in the present invention, and preferably no more than 280° C.

Detailed conditions regarding heating process are defined according to: a size and a specific resistance of silicon wafers used; an immersion device used for heating; a number of the silicon wafers to be treated etc., and a balance of a heating temperature and a heating period. Usually, the heating condition is preferably: 4-5 hours in case of heating temperature of 150° C.; 3-5 hours, in case of 200° C.; 30 minutes-3 hours, in case of 250° C.; and 20 minutes-1 hour, in the case of 300° C.

Next, in order to eliminate Cu that migrated to a vicinity of a surface from inside of silicon by the heating, the surface part of the silicon wafer is removed. As described in basic experiments in the FIG. 3, although the processing at heating temperatures (150-300° C.) specified by the present invention migrates Cu penetrated inside of a silicon wafer to a vicinity of a surface, it cannot migrate almost all Cu to a top surface. Therefore, Cu remains only by cleaning with top surface cleaning liquids usually used for metal removal. Then, the present invention has a second feature in which the removal of Cu that migrated to the vicinity of the surface by heating is made by removing a surface layer from a top surface of a silicon wafer to about 1 micrometer depth, instead of cleaning the top surface of the silicon wafer with the top surface cleaning liquids.

Here, as removal methods of a surface part used in the present invention, a chemical processing (processing with hydroxide alkalis and/or carbonate alkalis) or mechanical processing may be mentioned.

Among these, typically as chemical processings, an etching with alkali aqueous solutions, such as of alkali hydroxides and carbonates, may be mentioned. When an alkali aqueous solution is used, an effect is also expectable that deposition to a top surface of a silicon wafer of Cu dissolved by the aqueous solution concerned may be prevented. As alkali aqueous solutions used for the present invention, there may be mentioned: alkali hydroxides [for example, potassium hydroxide, sodium hydroxide, quaternary alkyl ammonium hydroxides, etc. (tetra methyl ammonium hydroxide, tetra ethyl ammonium hydroxide, etc.)]; and carbonate alkalis (for example, potassium carbonate and sodium carbonate). These may be used independently and two or more kinds may be used in combination. In detail, a silicon wafer should just be immersed into the alkali aqueous solutions. Immersion period is determined depending on Cu concentration remaining in a vicinity of a silicon wafer surface; heating conditions; a type, a concentration, and an amount of alkali solution to be used; a temperature; and a structure of an immersion device. In general, it is preferably 3-30 minutes (preferably no less than 5 minutes, and no more than 20 minutes).

On the other hand, a lapping, a grinding, a tape polishing, etc. are mentioned as mechanical processings, and a surface layer of a silicon wafer may be removed also using the methods.

In addition, after etching by the chemical processing or mechanical processing, known top surface cleaning liquids may be used independently, or two or more kinds may be used in combination. This processing may effectively prevent Cu of a silicon wafer from redepositing to a top surface. As such top surface cleaning liquids, any of cleaning liquids usually used for removing metals, such as Cu that exists on a top surface of a silicon wafer may be usable without any limitation, and for example, a mixed solution of an acidic solutions (these acidic solutions may be used independently and may be used in combination) of HCl, HF, and $HNO_3$ etc. and oxidizing agents (for example, $H_2O_2$ etc.) can be used.

As mentioned above, description was given about a method of reclaiming silicon wafers concerning the present invention.

Furthermore, a preferred embodiment of the present invention may include an immersion process with a predetermined chemical processing liquid before the heating. As is clearly described in fundamental experiments in the FIGS. 4-5, this process may efficiently migrate Cu inside a silicon wafer to a vicinity of a surface, and may adjust a neighboring area of the surface of the silicon wafer to a state suitable for outer diffusion of the Cu.

As treatment liquid for promoting such a diffusion function of Cu, $H_2O_2$, an SC1 liquid (mixture of $H_2O_2$, $NH_4OH$, and $H_2O$), an SC2 liquid (mixture of $H_2O_2$, HCl, and $H_2O$), alkali hydroxide aqueous solutions, or alkali carbonate aqueous solutions may be mentioned. These may be used independently, and two or more kinds may be used in combination. Immersion period is determined based on: Cu concentration remaining in the vicinity of a silicon wafer surface; heating conditions; a type, a concentration, and an amount of treatment liquid to be used; a temperature; and structure of an immersion device. In general, it is preferably 30 seconds-20 minutes (preferably no less than 1 minute, and no more than 10 minutes).

A method of the present invention is constituted as mentioned above, and the present invention may provide a method of reclaiming silicon wafers that may remove Cu not only deposited on a surface of a silicon wafer but penetrated inside of the silicon wafer, and that does not give Cu contamination inside of the silicon wafer.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A method of reclaiming a used silicon wafer having copper penetrated into the interior of the wafer from a semiconductor manufacturing process, comprising:

in the following order, a film removal process including removing at least one of a metal film, a metal silicide film, a metal oxide film, and a metal nitride film from the used silicon wafer to form a silicon wafer having a silicon surface;

contacting the silicon surface of the silicon wafer with at least one of an SC1 and an SC2 liquid to diffuse copper from the interior of the silicon wafer to the silicon surface of the silicon wafer;

a heating/removal process to remove a portion of the silicon surface of the silicon wafer;

a polishing process; and a cleaning process to form a reclaimed silicon wafer having a silicon surface and a concentration of copper of less than $2 \times 10^{12}$ atom/cm$^3$;

wherein the heating/removal process comprises (i) heating the silicon wafer at 150-300° C. for 20 minutes to 5 hours and (ii) a chemical process that comprises removing a surface part of the silicon wafer by etching the top surface of the silicon wafer with a solution comprising one or more of an alkaline hydroxide and an alkaline carbonate to a depth of about 1 μm.

2. The method of reclaiming silicon wafers according to claim 1, wherein the heating/removal process further comprises a mechanical removal process.

3. The method according to claim 1, wherein the heating/removal process does not form any oxygen donors.

4. The method according to claim 1, wherein the heating/removal process is carried out in air.

5. The method according to claim 1, wherein the heating/removal process is carried out to provide a silicon wafer having the same specific resistance of a virgin silicon wafer.

6. The method according to claim 1, wherein the heating/removal process does not vary the specific resistance of a P-type or N-type silicon wafer.

7. The method according to claim 1, further comprising:
one or more of (i) carrying out monitoring of a semiconductor chip manufacturing process with the silicon wafer and (ii) setting up one or more operating conditions of a semiconductor fabrication machine with the silicon wafer, before the film removal process.

8. The method according to claim 1, wherein the silicon wafers are testing wafers.

9. The method of reclaiming silicon wafers according to claim 1, wherein the top surface of the silicon wafer is etched with a solution comprising an alkaline hydroxide.

10. The method of reclaiming silicon wafers according to claim 1, wherein the top surface of the silicon wafer is etched with a solution comprising an alkaline carbonate.

11. The method of claim 1, wherein the only chemical process of the heating/removal process is immersing the silicon wafer in the solution comprising one or more of an alkaline hydroxide and an alkaline carbonate.

12. The method of claim 1, wherein the film removal process removes a metal oxide layer to form a silicon layer and the resulting silicon layer is contacted with an SC2 liquid.

13. The method of claim 1, wherein the silicon surface formed by the film removal process is contacted with an SC1 liquid.

14. The method of claim 1, wherein the film removal process removes a metal oxide layer to form a silicon layer and the resulting silicon layer is contacted with an SC1 liquid.

* * * * *